Nov. 17, 1959 R. L. BULLARD ET AL 2,913,674

SWEEP GENERATOR HAVING ELECTROMAGNETICALLY DRIVEN TUNING ELEMENT

Filed Feb. 16, 1955

INVENTORS
RICHARD L. BULLARD
KENNETH D. ERDMAN
BY
Ostrolenk & Faber
ATTORNEYS 2,913,674

SWEEP GENERATOR HAVING ELECTROMAGNETICALLY DRIVEN TUNING ELEMENT

Richard L. Bullard, Monterey Park, and Kenneth D. Erdman, Los Angeles, Calif., assignors to Standard Coil Products Co., Inc., Los Angeles, Calif., a corporation of Illinois Application February 16, 1955, Serial No. 488,545

7 Claims. (Cl. 331—178)

The present invention relates in general to electronic test systems and more particularly concerns apparatus for generating signals the frequency of which is varied at a constant repetition rate around a center frequency.

In numerous experimental and production line procedures, it has been advantageous to present graphically the relationship between relative output amplitude, for a fixed input amplitude, as a function of input frequency over a predetermined band. A representative example of this is encountered in the production line adjustment of multi-channel television tuners. A common procedure is to use a sweep oscillator whose mean frequency is adjusted to substantially the mid-point of the channel being tuned and whose frequency deviation in either direction is at least equal to one-half the channel band width. Using a cathode ray oscilloscope and applying the detected output of the tuner channel under test to the vertical deflection system and a sweep frequency to the horizontal deflection system, a characteristic band-pass curve is displayed upon the screen.

By proper interpretation, and if need be, by comparison with prior standardized curves, the tuner parameters such as amplitude response at different frequencies on the band may be adjusted so that the channel undergoing adjustment has precisely the required characteristics. With the exception of variation of mean frequency, the adjustments required for each channel are, in principle, essentially the same.

In previous testing apparatus the sweep oscillator was provided with a mechanical device controlled by electrical means so that motion of this mechanical device would cause the oscillator to vary its frequency between two pre-established values.

More particularly, the sweep oscillator of triode testing devices provided a tank circuit, one part of which could be moved mechanically to cause variation of the frequency of the oscillator within pre-established values. One example of this is a sweep oscillator the frequency of which is varied by means of the motion of a diaphragm of a speaker.

Other mechanical sweep devices provide, for example, a variable capacitor in the tank circuit having movable plates rotated at a constant angular speed by a driving motor. It will be noted that in both cases there is a mechanical connection between the driving member and the movable part of the tank.

The sweep oscillator of the present invention, on the other hand, utilizes a magnetic field varying at a constant repetition rate for causing suitable variation in the tank circuit of an oscillator.

Accordingly, one object of the present invention is a sweep oscillator, a tuning element of which is moved by means of a magnetic field without any mechanical interconnecting means between the driving member and the tuning element.

The sweep oscillator of the present invention is particularly adapted for use at ultra-high frequencies, that is, in the frequency range between a few hundred megacycles up to 1,000 or more megacycles.

The basic tank inductance of the sweep oscillator of the present invention consists of a conductive flat loop the inductance of which is varied by means of what is essentially a shorted element. The shorted element is made to move with respect to the conductive loop at a constant repetition rate so as to vary the inductance presented by the loop to the oscillator tube.

Accordingly, another object of the present invention is a UHF sweep oscillator of simple construction.

Still another object of the present invention is a UHF sweep oscillator the frequency of which is swept by means of a shorted turn of wire. A simple coil positioned in a plane perpendicular to the plane of the oscillator coil and energized at a fixed low frequency serves to move by magnetic attraction or repulsion the shorted turn of wire with respect to the oscillator inductive coil or vice versa.

The basic concept of the present invention resides in the utilization of a variable magnetic field for causing a repetitive relative movement of a shorted turn of wire with respect to an inductive coil or capacitive element to vary the inductance or capacitance, respectively, at this constant repetition rate.

By mechanically disconnecting the tuning element of the tank circuit from its driving means, the life of the sweep oscillator is increased because of the lower specific weight which makes for less mass than when connected to the movable member of a speaker. It should further be noted that the movable element of a speaker tends to tear apart.

This does not occur in the present oscillator since the motion of the shorted turn of wire occurs only through the action of the variable magnetic field on the shorted turn of wire.

Electrically the control of the motion of the shorted turn of wire is made considerably easier and the transfer of energy from the energizing coil to the shorted turn of wire is made more efficient since there is no mechanical coupling member and, therefore, no loss caused by such a coupling member.

In one embodiment of the present invention the shorted turn of wire is cemented to the tank circuit inductance at the extreme end of the tank circuit inductance. In this case the mechanical movement of the shorted turn with respect to the tank inductance depends on the fact that when an appropriately positioned energizing coil is excited by means of an alternating current, the tank inductance bends in an arc due to the fact that one end is secured to the chassis or more precisely to a tube socket. The end that bends is more precisely the extreme end to which the shorted turn of wire is secured.

Thus, the magnetic deflection force produced by the energizing coil and applied to that extreme end of the tank inductance causes the shorted turn to move away from the tank inductance at the point opposite to the one at which the shorted turn is secured to the tank inductance, resulting in oscillator tank inductance or capacitance change or oscillator frequency change.

In another embodiment of the present invention the shorted turn is pivoted on the tank inductance at the opposite ends of a diameter. Actually two spring wires normally bias the shorted turn at an angle with respect to the tank inductance.

When the energizing coil is excited, the shorted turn describes an arc around its pivots with respect to the tank inductance at a constant repetition rate. By position and this means it is possible to obtain a sweep, the frequency of which is twice that of the A.C. supply applied to the energizing coil.

To obtain a sweep of the same repetition rate as that of the exciting energy, it is possible to use, for example, a half wave voltage applied to the energizing coil.

The foregoing and many other objects of the invention will become apparent in the following description and drawings in which.

Figure 1:
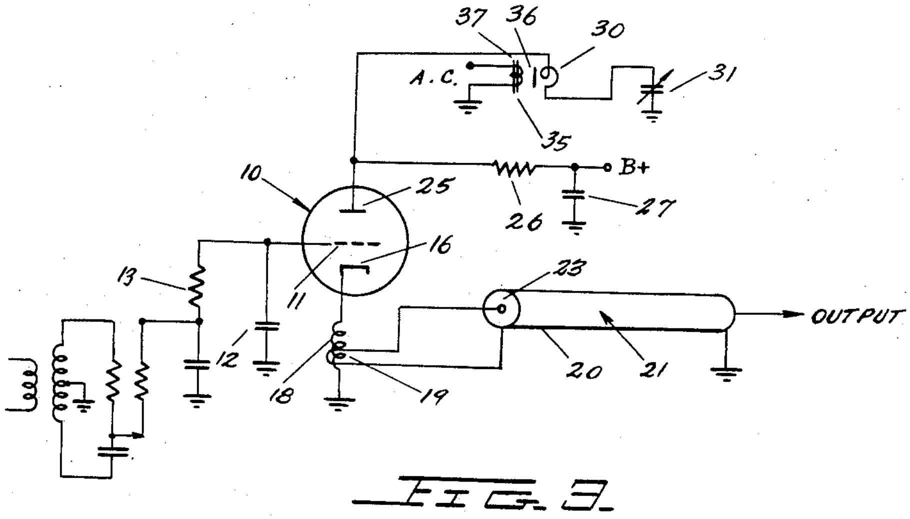
Figure 1 is a schematic circuit diagram of the sweep oscillator of the present invention.

Referring first to Figure 1, the oscillator tube 10 is of a type designed for operation at ultra-high frequencies, for example a 6AF4 or 6T4. In this particular embodiment the 6AF4 tube operates in a grounded grid circuit. In fact, its grid 11 is connected to ground through capacitor 12 in shunt with a biasing resistor 13.

Cathode 16 of tube 10 is connected to ground through a coil 18 with a second coil 19 mutually coupled to coil 18. Coils 18 and 19 constitute actually a bifilar coil. Coil 19 has a ground side connected to the outer sleeve 20 of the coaxial terminal 21. The high side of coil 19 is connected to the inner conductor 23 of coaxial terminal 21. The desired UHF signals are obtained from this output terminal 21. This is one of several methods of removing the signal.

Plate 25 of oscillator tube 10 is connected through a plate load resistor 26 to the B+ supply which is bypassed to ground by a capacitor 27. Plate 25 is also connected to the tank inductance 30 which is connected in series to a trimming capacitor 31 and in turn connected to ground. Inductance 30 is a variable inductance and through repetitive variation of its magnitude it causes the frequency of oscillation of oscillator tube 10 to vary between two pre-established values in the UHF region, the two pre-established values of frequency being on each side of a center frequency.

The means for varying inductance 30 are shown schematically at 35 and consist basically of a movable conducting member 36 and an energizing coil 37. When an alternating signal having the desired frequency is applied to coil 37, coil 37 will generate a magnetic flux which will vary at the frequency of the applied A.C. signal.

This variation in magnetic flux causes a movement of the conductive member 36 or 30, depending upon the form used with respect to the other elements, to thus vary the inductance of inductive coil 30 at a constant repetition rate so as to vary the frequency of oscillation of oscillator tube 10 also at a constant repetition rate within two pre-established values, the two pre-established values being determined by the two extreme positions which conductive member 36 and 30 can occupy during its travel when energized by the energizing coil 37.

Figure 2:
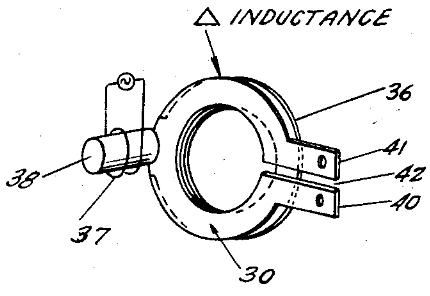
Figure 2 is a detail view of one form of the novel variable tank inductance of the present invention in which a gap is obtained by connecting the shorted turn to the tank at the extremity.

Figure 2 shows the actual physical embodiment of the magnetic sweep element 30—35. It will be seen that inductance 30 consists of a single turn of wire since the sweep oscillator is to operate in the UHF range. The single turn of wire is actually a flat stamped piece of silvered steel shaped approximately in the form of a circle and having two parallel terminal members 40 and 41 between which is a slot 42.

The shorted turn 36 is placed so that its center coincides with the center of the tank coil 30. Both the tank coil 30 and the shorted turn 36 are silver plated and then dipped in a liquid insulator, for example liquid polystyrene.

The energizing coil 37 is wound around a metallic core 38 and core 38 is positioned so that one of its end surfaces is located in a plane parallel to the plane of the flat tank inductance 30. More precisely, coil 37 with core 38 is positioned at one edge of the tank inductance 30, the edge at which tank inductance 30 is secured to shorted turn 36. Tank inductance 30 is secured through the two parallel terminals 40 and 41 to an insulating support mounted on the chassis of this sweep oscillator as described in more detail hereinafter in connection with Figure 3.

To the energizing coil 37 is applied an A.C. supply, for example having a frequency of 60 cycles. When coil 37 is so energized, it will produce a magnetic pulling force at both ends of core 38 and since core 38 with coil 37 is fixedly mounted on the chassis also as described more in detail hereinafter in connection with Figure 3, the magnetic pulling force will move the tank inductance 30 thus bending it with respect to the stationarily mounted terminals 40 and 41.

Since, however, the shorted turn 36 is secured to the tank inductance 30 at the edge where coil 37 and core 38 are located, motion of that end of tank inductance 30 or better the bending in an arc of tank inductance 30 causes the other end of the shorted turn to move with respect to the slot 42 of tank inductance 30 which remains stationary because of the fixed mount of terminals 40 and 41.

It will be easily seen that when the separation between the shorted turn 36 and the tank inductance slot 42 is at a maximum, then the capacity across the slot 42 will be at a minimum, and therefore the frequency of oscillation of oscillator tube 10 will be at a minimum. This variation in capacity will occur at the same rate as the energizing A.C. signal applied to coil 37. Actually, the oscillator frequency may be varied, for example, at either 60 or 120 cycles per second depending on the length of the tank inductance 30.

It is found in this embodiment that it is possible to obtain sweep width of approximately 100 megacycles in the UHF range.

Figure 3:
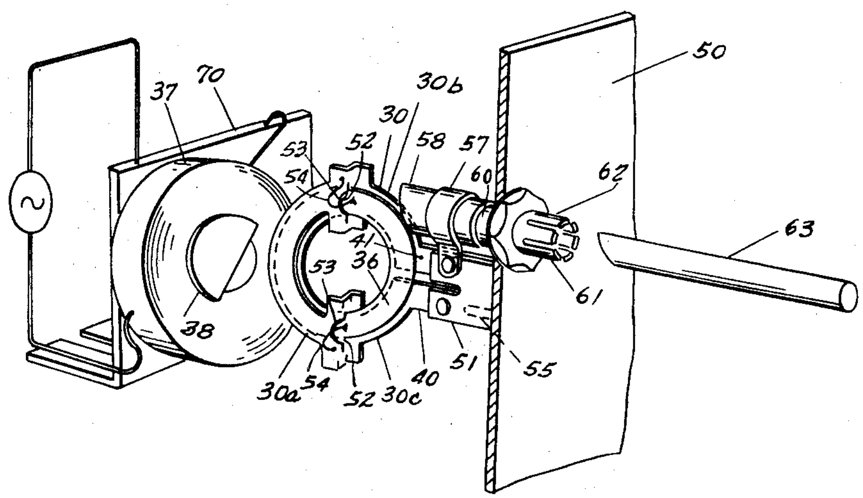
Figure 3 is another embodiment of the variable tank inductance of the present invention in which the movable member is pivoted at the center.

Another configuration of the sweep device of the present invention is shown in Figure 3. Referring to Figure 3 it will be seen that mounted on a chassis 50 is an insulating support 51 to which are secured the two terminals 40 and 41 of the flat tank inductance 30. Tank inductance 30 consists in this case essentially of three members, a semi-circular member **30*a* and two additional members 30*b* and 30*c*, which form with section 30*a* a complete circular flat element. Inductance 30** is one part of formed non-magnetic material with a slot coil in it.

Elements **30*a*, 30*b* and 30*c* are connected together at appropriate terminations 52 and are so shaped at these terminations that after they are so connected together a slot 53 is produced at each of these two terminations. This permits the mounting of the shorted turn 36 through these slots 53. Shorted turn 36 is pivoted at these two slots so that it rotates around the diameter defined approximately by the two slots 53. This shorted turn 36 is normally biased at an angle with respect to the tank inductance 30. The biasing means may be simple wire springs 54 one end of each of which is secured to the tank inductance 30 and the other end to the shorted turn 36. The joining of these connections must be made with some insulating cement so as not to produce electrical contact between shorted turn 36 and tank inductance 30. The pivot spring is fastened to opposite sides of tank inductance 30. Connection to shorted turn 36** is mechanical by means of an insulator sleeve and then mechanically held by cement.

One terminal 40 of tank inductance 30 is connected through an appropriate pin 55 of a socket (not shown) and thence to the correct pin of the oscillator tube 10. The flat terminal 41 is connected to a conductive sleeve 57 which is in electrical contact with the cylindrical member 58 which is hollow and which is mounted around an insulating sleeve 60.

Extending external from chassis 50 is a conductive cylindrical member 61 which is electrically connected to chassis 50 as shown in Figure 3 and which is provided with resilient fingers 62 so that a conductive rod 63 when introduced in cylinder 61 and, therefore, in the interior of insulating sleeve 60 will retain whatever position the operator has initially given to it.

Electrical conductive cylinder 58 and conductive member 63 constitute the plates of a cylindrical capacitor. The insulating sleeve 60 serves as a dielectric for this capacitor which in Figure 1 was denoted by numeral 31.

The function of capacitor 31, as mentioned in connection with Figure 1, is to establish a mean operating frequency of oscillation of oscillator 10.

Also mounted to chassis 50 through a metallic bracket 70 is the coil 37 wound around core 38. Core 38 with coil 37 is secured to bracket 70 in any appropriate way, for example by means of a screw (not shown) engaging an opening (not shown) in bracket 70 and an appropriate threaded bore in core 38.

As shown in Figure 3, core 38 is positioned in a plane perpendicular to the plane of the tank inductance 30 and on one side of tank inductance 30 so that when coil 37 is energized by the A.C. supply schematically shown in Figure 3, the shorted turn 36 will move around the previously mentioned diameter with respect to the tank inductance 30 so as to produce a sweep at the output of oscillator 10 having a repetition rate which is twice that of the A.C. signal applied to coil 37.

If it is desired to have a sweep of the same frequency as the applied A.C. signal, it will be necessary to connect the half wave rectifier to the A.C. source, thus making use of only one half of the A.C. signal.

It should be noted that the wire springs 54 do not necessarily have to have the shape shown in Figure 3 as long as they can produce the biasing action for shorted turn 36 with respect to tank inductance 30.

We claim:

1. A sweep oscillator operable at ultra-high frequencies comprising a tank inductance, said tank inductance having a flat conductive loop and a complementary shorted element, said shorted element being constructed to be movable responsive to an external magnetic field; electromagnetic means energizable to create a variable magnetic field for moving said shorted element with respect to said flat conductive loop at a constant repetition rate to vary the said frequency at a constant repetition rate to provide the necessary sweep, said flat conductive loop being ring shaped and split at one end, an oscillator tube, the split ends of said ring being connected, respectively, to the plate of said oscillator tube and ground, said shorted element comprising a flat conductive ring-shaped loop pivoted for rotation around a diameter on said flat conductive ring-shaped loop having split ends.

2. A sweep oscillator operable at ultra-high frequencies comprising a tank inductance, said tank inductance having a flat conductive loop and a complementary shorted element, said shorted element being constructed to be movable response to an external magnetic field; electromagnetic means energizable to create a variable magnetic field for moving said shorted element with respect to said flat conductive loop at a constant repetition rate to vary the said inductance at a constant repetition rate to provide the necessary sweep, said flat conductive loop being ring-shaped and split at one end, an oscillator tube, the split ends of said ring being connected, respectively, to the plate of said oscillator tube and ground, said shorted element comprising also a flat conductive ring-shaped loop pivoted for rotation around a diameter on said flat conductive ring-shaped loop having split ends, said electromagnetic means comprising a core, a coil surrounding said core, means for energizing said coil at said constant repetition rate.

3. A sweep oscillator operable at ultra-high frequencies comprising a tank inductance, said tank inductance having a flat conductive loop and a complementary shorted element, said shorted element being constructed to be movable responsive to an external magnetic field; electromagnetic means energizable to create a variable magnetic field for moving said shorted element with respect to said flat conductive loop at a constant repetition rate to vary the said inductance at a constant repetition rate to provide the necessary sweep, said flat conductive loop being ring-shaped and split at one end, an oscillator tube, the split ends of said ring being connected, respectively, to the plate of said oscillator tube and ground, said shorted element comprising also a flat conductive ring-shaped loop pivoted for rotation around a diameter on said first ring, means for moving said second ring with respect to said flat conductive ring-shaped loop having split ends, said electromagnetic means comprising a core, a coil surrounding said core, means for energizing said coil at said constant repetition rate, the plane of said split ring being parallel to the axis of said core, the plane of said split ring being offset in one direction with respect to a plane parallel to said split ring and passing through the axis of said core.

4. A variable reactance comprising a flat inductive loop with predeterminedly spaced ends, a flat short-circuited member of magnetic material, said member being arranged substantially parallel to said inductive loop and being mounted to be pivotally displaceable with respect to said spaced ends, said member being secured to a portion of said inductive loop remote from its spaced ends, a section of said member being capacitively related to the spaced ends, and means for establishing a magnetic field varying at a constant repetition rate effective upon said magnetic member to correspondingly pivotally displace its said section towards and away from said spaced ends and thereby sweep the variable reactance about a predetermined reactance value.

5. A variable reactance comprising a flat inductive loop with predeterminedly spaced ends, a flat short-circuited loop of substantially the same diameter as said inductive loop and being of magnetic material, said short-circuited loop being arranged substantially parallel to said inductive loop and being mounted to be pivotally displaceable with respect to said spaced ends, said short-circuited loop being secured to a portion of said inductive loop remote from its spaced ends, the spaced ends of said inductive loop being fixedly supported, a section of said short-circuited loop being capacitively related to the spaced ends, and means for establishing a magnetic field varying at a constant repetition rate effective upon said short-circuited loop to correspondingly pivotally displace its said section towards and away from said spaced ends with said magnetic field being effective near the juncture of said loops for deflecting them thereat and thereby sweep the variable reactance about a predetermined reactance value.

6. A variable reactance comprising a flat inductive loop with predeterminedly spaced ends, a flat short-circuited member of magnetic material, said member being arranged substantially parallel to said inductive loop and being mounted to be pivotally displaceable with respect to said spaced ends, said member being pivotally mounted upon said inductive loop with a major sector of the member arranged opposite each face of said inductive loop, a section of said member being capacitively related to the spaced ends, and means for establishing a magnetic field varying at a constant repetition rate effective upon said magnetic member to correspondingly pivotally displace its said section towards and away from said spaced ends and thereby sweep the variable reactance about a predetermined reactance value.

7. A variable reactance comprising a flat inductive loop with predeterminedly spaced ends, a flat short-circuited loop of substantially the same diameter as said inductive loop and being of magnetic material, said short-circuited loop being arranged substantially parallel to said inductive loop and being mounted to be pivotally displaceable with respect to said spaced ends, a section of said short-circuited loop being capacitively related to the spaced ends, said short-circuited loop being pivotally mounted along a diameter of said inductive loop with a major sector of the short-circuited loop arranged opposite each face of said inductive loop, the spaced ends of said inductive loop being fixedly supported, and biasing spring means between the pivoted short-circuited loop and said inductive loop, and means for establishing a magnetic field varying at a constant repetition rate effective upon said short-circuited loop to correspondingly pivotally displace its said section towards and away from said spaced ends and thereby sweep the variable reactance about a predetermined reactance value.

References Cited in the file of this patent

UNITED STATES PATENTS

| | | |
|---|---|---|
| 1,606,792 | Isles | Nov. 16, 1926 |
| 2,084,586 | Linsell | June 22, 1937 |
| 2,219,922 | Gossel | Oct. 29, 1940 |
| 2,381,940 | Wallace et al. | Aug. 14, 1945 |
| 2,407,270 | Harrison | Sept. 10, 1946 |
| 2,435,487 | Adler | Feb. 3, 1948 |
| 2,471,155 | Langmuir et al. | May 24, 1949 |
| 2,656,517 | Johnson | Oct. 20, 1953 |
| 2,752,499 | Hanthorn | June 26, 1956 |